US011574974B2

(12) United States Patent
Liu

(10) Patent No.: US 11,574,974 B2
(45) Date of Patent: Feb. 7, 2023

(54) DISPLAY PANEL AND DISPLAY DEVICE

(71) Applicant: BOE TECHNOLOGY GROUP CO., LTD., Beijing (CN)

(72) Inventor: Jiayao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 347 days.

(21) Appl. No.: 16/472,478

(22) PCT Filed: Sep. 17, 2018

(86) PCT No.: PCT/CN2018/106004
§ 371 (c)(1),
(2) Date: Jun. 21, 2019

(87) PCT Pub. No.: WO2019/072071
PCT Pub. Date: Apr. 18, 2019

(65) Prior Publication Data
US 2021/0134844 A1 May 6, 2021

(30) Foreign Application Priority Data
Oct. 13, 2017 (CN) .......................... 201710954330.8

(51) Int. Cl.
H01L 27/32 (2006.01)
G02B 30/26 (2020.01)
(Continued)

(52) U.S. Cl.
CPC .......... H01L 27/326 (2013.01); G02B 3/0037 (2013.01); G02B 30/10 (2020.01);
(Continued)

(58) Field of Classification Search
CPC ............. H01L 27/1214; H01L 51/5275; H01L 27/3262; H01L 27/326; G02B 30/26;
(Continued)

(56) References Cited

U.S. PATENT DOCUMENTS 5,661,531 A * 8/1997 Greene .................... G09G 3/20
349/73
5,982,469 A * 11/1999 Awane ................ G02F 1/13454
349/158
(Continued)

FOREIGN PATENT DOCUMENTS

CN 103472589 A 12/2013
CN 104394402 A 3/2015
(Continued)

OTHER PUBLICATIONS

First Chinese Office Action dated Feb. 26, 2019.
International Search Report and Written Opinion dated Dec. 26, 2018.

Primary Examiner — S M Sohel Imtiaz
(74) Attorney, Agent, or Firm — Dilworth & Barrese, LLP.; Michael J. Musella, Esq.

(57) ABSTRACT

A display panel and a display device. The display panel includes a plurality of pixel island regions. Each pixel island region includes effective display regions of at least two pixel units. The distance between the adjacent pixel units in each pixel island region is less than the distance between the adjacent pixel island regions.

16 Claims, 4 Drawing Sheets

(51) Int. Cl.
*G02B 3/00* (2006.01)
*G02F 1/1335* (2006.01)
*H01L 27/12* (2006.01)
*H01L 51/52* (2006.01)
*G02B 30/10* (2020.01)
*G02F 1/1368* (2006.01)

(52) U.S. Cl.
CPC ....... *G02B 30/26* (2020.01); *G02F 1/133526* (2013.01); *H01L 27/1214* (2013.01); *H01L 51/5275* (2013.01); *G02F 1/1368* (2013.01); *H01L 27/3262* (2013.01)

(58) Field of Classification Search
CPC . G02B 3/0037; G02B 30/10; G02F 1/133526; G02F 1/1368
See application file for complete search history.

(56) References Cited

U.S. PATENT DOCUMENTS

| | | | |
|---|---|---|---|
| 10,302,958 | B2 | 5/2019 | Zhou et al. |
| 2001/0043163 | A1* | 11/2001 | Waldern ............... G06F 3/013 345/7 |
| 2003/0155612 | A1* | 8/2003 | Kawachi ............... H01L 27/12 257/E27.111 |
| 2006/0157711 | A1* | 7/2006 | Kang ................. H01L 27/1296 257/E27.111 |
| 2010/0073462 | A1 | 3/2010 | Lee et al. |
| 2010/0097525 | A1 | 4/2010 | Mino |
| 2012/0326950 | A1* | 12/2012 | Park .................... G09G 3/3607 345/55 |
| 2013/0286053 | A1* | 10/2013 | Fleck ................... G09G 3/3208 345/82 |
| 2014/0197428 | A1* | 7/2014 | Wang ................ G07F 17/3211 257/88 |
| 2015/0138755 | A1* | 5/2015 | Bastani ............. G02F 1/133602 362/97.1 |
| 2015/0287751 | A1* | 10/2015 | Jin ..................... H01L 27/1248 438/23 |
| 2015/0379950 | A1* | 12/2015 | Sun ..................... G09G 3/3614 345/87 |
| 2016/0231580 | A1 | 8/2016 | Lieberman et al. |
| 2016/0266283 | A1* | 9/2016 | Segawa ............... G02B 5/0257 |
| 2017/0133438 | A1* | 5/2017 | Seo ........................ H01L 51/56 |
| 2018/0107074 | A1* | 4/2018 | Xu .................... G02F 1/133602 |
| 2018/0113358 | A1* | 4/2018 | Lee .................... G02F 1/133528 |
| 2018/0213153 | A1* | 7/2018 | Iso ........................ G06T 5/006 |
| 2018/0267358 | A1* | 9/2018 | Choi ................. H01L 27/3276 |
| 2019/0258071 | A1 | 8/2019 | Dong et al. |
| 2020/0185420 | A1* | 6/2020 | Ikeda ................. H01L 27/1225 |
| 2020/0285105 | A1* | 9/2020 | Chen .................. H01L 27/3288 |
| 2020/0292898 | A1* | 9/2020 | Fujikawa .......... G02F 1/136286 |
| 2021/0083211 | A1* | 3/2021 | Park ..................... H01L 51/52 |

FOREIGN PATENT DOCUMENTS

| | | | | |
|---|---|---|---|---|
| CN | 104883555 | A | | 9/2015 |
| CN | 105759514 | A | | 7/2016 |
| CN | 205487282 | U | * | 8/2016 ....... G02F 1/133514 |
| CN | 206364017 | U | * | 7/2017 |
| CN | 206364017 | U | | 7/2017 |
| CN | 107085481 | A | | 8/2017 |
| CN | 107561723 | A | | 1/2018 |
| CN | 107678167 | A | | 2/2018 |

* cited by examiner

DISPLAY PANEL AND DISPLAY DEVICE

The present application claims priority of China Patent application No. 201710954330.8 filed on Oct. 13, 2017, the content of which is incorporated in its entirety as portion of the present application by reference herein.

TECHNICAL FIELD

Embodiments of the present disclosure relate to a display panel and a display device.

BACKGROUND

Integral imaging display technology is a true three-dimensional (3D) display without any visual-aid equipment (e.g. polarized glasses). The integral imaging display technology utilizes the principle of optical path reversibility, in which, stereoscopic information of a 3D scene is recorded onto an image recording device by a pinhole array or a microlens array, to generate a micro image array, then the micro image array is displayed on a 2D display screen, and a stereoscopic image of the original 3D scene is regenerated by the pinhole array or microlens array. Integral imaging display technology can be viewed directly by naked eyes, and can render a stereoscopic image of full parallax and full true color, and it is one of the main ways in the field of 3D display at present.

SUMMARY

At least one embodiment of the present disclosure provides a display panel, which includes a plurality of pixel island areas, each of the plurality of pixel island areas includes active display areas of at least two pixel units, and a distance between two adjacent ones of the at least two pixel units in each of the plurality of pixel island areas is smaller than a distance between two adjacent ones of the plurality of pixel island areas.

For example, in the display panel provided by an embodiment of the present disclosure, the display panel further includes an interval area, surrounding the plurality of pixel island areas, the interval area is a non-display area.

For example, in the display panel provided by an embodiment of the present disclosure, each of the at least two pixel units includes a driving element, and the driving element is located in the interval area.

For example, in the display panel provided by an embodiment of the present disclosure, the driving element includes a thin film transistor.

For example, in the display panel provided by an embodiment of the present disclosure, the plurality of pixel island areas are arranged non-uniformly in a displaying face of the display panel.

For example, in the display panel provided by an embodiment of the present disclosure, each of the plurality of pixel island areas includes active display areas of at least three pixel units, and the active display areas of the at least three pixel units in each of the plurality of pixel island areas are arranged in an array.

For example, in the display panel provided by an embodiment of the present disclosure, the active display areas of the at least two pixel units in each of the plurality of pixel island areas are configured to separately emit light for different gaze points.

For example, in the display panel provided by an embodiment of the present disclosure, the distance between two adjacent ones of the plurality of pixel island areas is three times greater than the distance between two adjacent ones of the at least two pixel units in each of the plurality of pixel island areas.

At least one embodiment of the present disclosure further provides a display device, including the display panel according to any one of the above.

For example, in the display device provided by an embodiment of the present disclosure, the display device further includes: a microlens array, including a plurality of microlenses, the plurality of microlenses are disposed in one-to-one correspondence with the plurality of pixel island areas, and each of the plurality of microlenses is configured to project light emitted by a corresponding pixel island area to a human-eye observing range.

For example, in the display device provided by an embodiment of the present disclosure, each of the plurality of microlenses includes a triangular microlens, a rectangular microlens or a hexagonal microlens.

For example, in the display device provided by an embodiment of the present disclosure, each of the plurality of microlenses is configured to project light emitted by the active display areas of the at least two pixel units of the corresponding pixel island area to different gaze points.

For example, in the display device provided by an embodiment of the present disclosure, the microlens array are configured to focus light emitted by the active display areas of the at least two pixel units of the plurality of pixel island areas to at least two gaze points of the human-eye observing range.

For example, in the display device provided by an embodiment of the present disclosure, the active display areas of the at least two pixel units arranged in each of the plurality of pixel island areas include an active display area of a first pixel unit, an active display area of a second pixel unit, and an active display area of a third pixel unit, the microlens array is configured to focus light emitted by the active display areas of the first pixel units provided in the plurality of pixel island areas at a first gaze point of the human-eye observing range, to focus light emitted by the active display areas of the second pixel units provided in the plurality of pixel island areas at a second gaze point of the human-eye observing range, and to focus light emitted by the active display areas of the second pixel units provided in the plurality of pixel island areas at a third gaze point of the human-eye observing range.

For example, in the display device provided by an embodiment of the present disclosure, the display device further includes: a pinhole array, including a plurality of pinholes, the plurality of pinholes are disposed in one-to-one correspondence with the plurality of pixel island areas.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
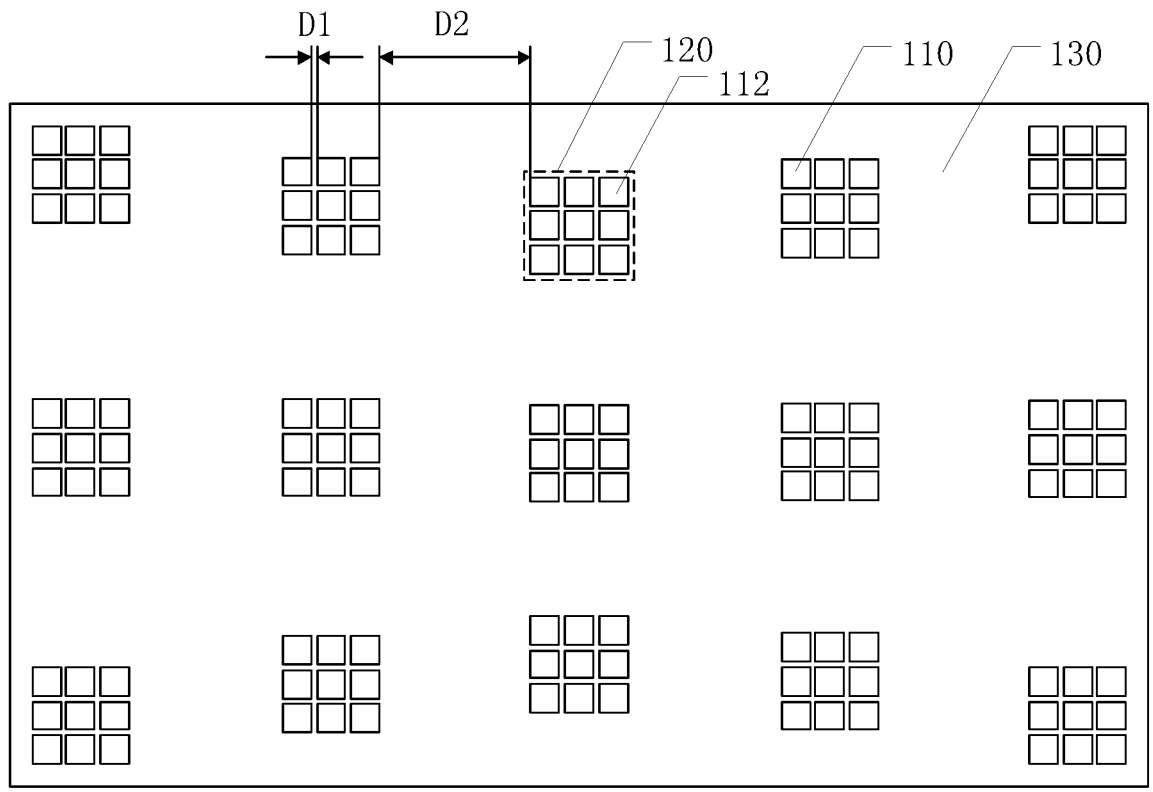
FIG. 1 is a schematic plan view of a display panel provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be in the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The terms "connection", "connected" and the like are not limited to physical or mechanical connection but may include electrical connection, either directly or indirectly.

In the study, the inventor(s) of the present application notices that, upon a usual display panel being applied into the integral imaging display technology, a large number of pixels on the display panel are often in a closed state, resulting in low pixel utilization ratio of the display panel. Moreover, it is very difficult to increase the resolution or PPI (Pixel Per Inch) of the display panel further more because of the uniform arrangement of pixels on the usual display panel.

Embodiments of the present disclosure provide a display panel and a display device. The display panel includes a plurality of pixel island areas, each of which includes active display areas of at least two pixel units, and a distance between two adjacent ones of the at least two pixel units in each of the plurality of pixel island areas is smaller than a distance between two adjacent ones of the plurality of pixel island areas. That is, for the display panel, active display areas of a plurality of pixel units are provided in a plurality of pixel island areas, and each of the plurality of pixel island area includes active display areas of at least two pixel units. In a case where the display panel is applied in the integral imaging display technology, the plurality of pixel island areas can be used for display, while an area among the plurality of pixel island areas is not used for display. In this way, the plurality of pixel island areas can be provided with active display areas of the plurality of pixel units, and thus the pixel utilization ratio of the display panel can be improved. In addition, because active display areas of pixel units are not provided in the area among the plurality of pixel island areas, some driving elements of the plurality of pixel units can be arranged in this area. Thereby, the area of a pixel unit arranged in each of the plurality of pixel island areas can be reduced, and then, more active display areas of pixel units can be arranged in each of the plurality of pixel island areas. Consequently, the resolution or PPI of each of the plurality of pixel island areas can be improved.

Hereinafter, the display panel and the display device provided by embodiments of the present disclosure will be described in detail with reference to accompanying drawings.

An embodiment of the present disclosure provides a display panel. FIG. 1 is a schematic plan view of a display panel provided by an embodiment of the present disclosure. As shown in FIG. 1, the display panel includes a plurality of pixel island areas 120, each of plurality of pixel island areas 120 includes active display areas 112 of at least two pixel units 110, and a distance between two adjacent ones of the at least two pixel units 110 in each of the plurality of pixel island areas 120 is smaller than a distance between two adjacent ones of the plurality of pixel island areas 120. It is to be noted that, the above-described active display area refers to an area where the pixel unit can emit light or permit transmission of light and display is performed.

In the display panel provided by the present embodiment, active display areas of pixel units of the display panel are distributed in a plurality of pixel island areas of the display panel, and pixel units or active display areas of pixel units may not be arranged among the plurality of pixel island areas. Upon the display panel being applied in the integral imaging display technology, a plurality of pixel island areas may be arranged in correspondence with a microlens array or a pinhole array. In this case, the plurality of pixel island areas may be used for display, while an area among the plurality of pixel island areas is not used for display and has no pixel unit or active display area of pixel unit provided therein. Thus, the pixel utilization ratio of the display panel can be improved while integral imaging is achieved. For example, the pixel utilization ratio of the display panel can reach 100%. In addition, because no pixel unit is provided in the area among the plurality of pixel island areas, and each of the plurality of pixel island areas may only include active display areas of at least two pixel units, some driving elements (e.g., thin film transistors) of the at least two pixel units can be provided among the plurality of pixel island areas rather than in the plurality of pixel island areas. Thereby, more active display areas of pixel units can be arranged in each of the plurality of pixel island areas, and then, the resolution or PPI of each of the plurality of pixel island areas can be improved.

It is to be noted that, in the display panel provided by the present embodiment, each of the plurality of pixel island areas includes active display areas of at least two pixel units, and the active display areas of at least two pixel units in each of the plurality of pixel island areas can separately emit light for different gaze points. For example, each of the plurality of pixel island areas includes active display areas of two pixel units; for each of the plurality of pixel island areas, light for a first gaze point may be emitted by an active display area of one of the two pixel units and are received by a left eye through projection of a microlens or a pinhole, and light for a second gaze point may be emitted by an active display area of the other one of pixel units and are received by a right eye through projection of a microlens or a pinhole. A 3D display can be realized by performing a specific image rendering on pixels. It is to be noted that, the "light for different gaze points" as stated above may refer to pixel points for the same spot on the same object at different gaze points, or pixel points for different spots on the same object at different gaze points.

For example, as shown in FIG. 1, in each of the plurality of pixel island area 120, the distance between two adjacent ones of the at least two pixel units 110 is D1; and in the display panel, the distance between two adjacent ones of the plurality of pixel island areas 120 is D2. As shown in FIG. 1, D2 is greater than D1. For example, in some examples, D2 is n times greater than D1, where n is greater than or equal to 3.

For example, in some examples, as shown in FIG. 1, the plurality of pixel island areas 120 may be disposed non-uniformly. Upon the display panel being applied in the integral imaging, the plurality of pixel island areas are arranged in one-to-one correspondence with a plurality of microlenses in a microlens array or a plurality of pinholes in a pinhole array. Light emitted by each of the plurality of pixel island areas needs to be projected into a human-eye observing range by a corresponding microlens or a corresponding pinhole, and therefore relative position relationships between the pixel island areas in different places of the display panel and the corresponding microlenses or pinholes are different. As a result, the plurality of pixel island areas are arranged non-uniformly. For example, upon an orthographic projection of the human-eye observing range on the display panel is in an intermediate area of the display panel, a pixel island area at each edge of the display panel needs to deviate from a center of the corresponding microlens or the corresponding pinhole, so as to ensure that light emitted by the pixel island area can be projected into the human-eye observing range. It is be noted that, the specific position of each of the plurality of pixel island areas on the display panel may be set according to a size of the display panel and a position and a size of the human-eye observing range.

Figure 2:
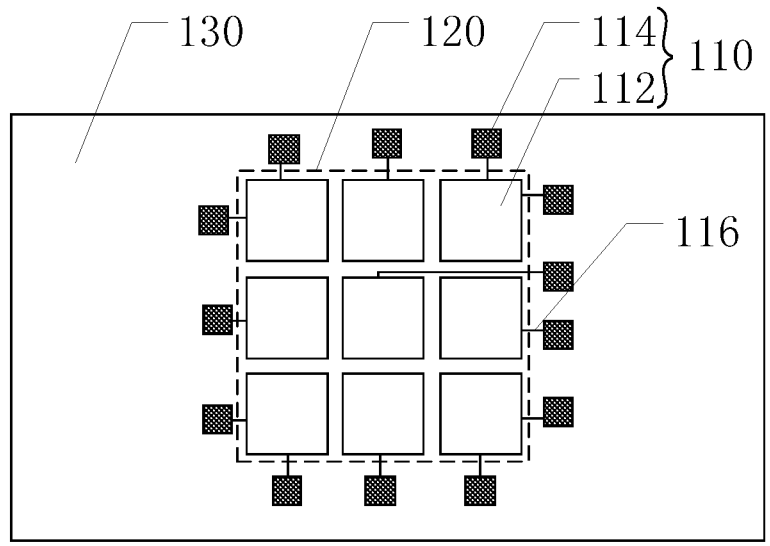
FIG. 2 is a partial schematic diagram of a display panel provided by an embodiment of the present disclosure.

FIG. 2 is a partial schematic diagram of a display panel provided by an embodiment of the present disclosure. As shown in FIG. 2, the display panel further includes an interval area 130 surrounding a plurality of pixel island areas 120; and the interval area 130 is a non-display area. That is, the interval area 130 has no pixel unit 110 provided therein or has no active display area 112 of a pixel unit 110 provided therein, and does not emit light or permit transmission of light for display. Relative to the usual display panel, upon the display panel provided by the present embodiment being used for integral imaging, active display area of pixel unit is not provided in the interval area, on the one hand, the utilization ratio of pixel unit can be improved, and on the other hand, material and costs can be saved.

For example, in some examples, each of the plurality of pixel units further includes a liquid crystal layer or an organic light emitting layer. That is, type of the display panel may be a liquid crystal display panel or an organic light emitting diode display panel.

For example, in some examples, each pixel unit 110 may include a driving element 114, and the driving element 114 may be located in the interval area 130, as shown in FIG. 2. That is, the driving element 114 may be disposed outside the pixel island area 120. Thus, more active display areas of pixel units can be arranged in each of the plurality of pixel island areas, and then the resolution or PPI of each pixel island area can be improved.

For example, in some examples, as shown in FIG. 2, each driving element 114 may be connected to an active display area 112 of the corresponding pixel unit 110 via a wire 116.

For example, in a case where the type of the display panel is a liquid crystal display panel, the driving element 114 may include a thin film transistor, for controlling on/off of the corresponding pixel unit. However, because the thin film transistor is usually opaque, and a black matrix needs to be arranged on the thin film transistor, an area corresponding to the driving element cannot be used for light-transmissive display in this case. By setting the driving element 114 in the interval area 130, it is possible that only active display areas 112 of the at least two pixel units 110 are provided in each of the plurality of pixel island areas 120. Thus, more active display areas 112 of pixel units 110 can be provided in each of the pixel island areas with the same area, and then, the resolution or PPI of each of the plurality of pixel island areas can be improved.

For example, in a case where the type of the display panel is an organic light emitting diode display panel, the driving element 114 may include a thin film transistor of various elements for driving an organic light emitting diode pixel unit to emit light, such as a capacitor and a thin film transistor. Likewise, by setting the driving element 114 in the interval area 130, it is possible that only active display areas 112 of pixel units 110 are arranged in each of the plurality of pixel island areas 120. Thus, more active display areas 112 of pixel units 110 can be provided in each of the plurality of pixel island areas with the same area, and then the resolution or PPI of each pixel island area can be improved. It is worth noting that, because driving elements of the organic light emitting diode display panel occupy a larger area, a greater improvement of the resolution or PPI can be realized by setting the driving elements in an interval area in the case where the type of the display panel is an organic light emitting diode display panel.

It is to be noted that, the type of the display panel provided by an embodiment of the present disclosure is not limited to liquid crystal display panel and organic light emitting diode display panel as described above, and may also be a display panel of other type, such as an electronic paper display panel. In addition, upon driving elements being arranged in the interval area, in each pixel island area, besides active display areas of pixel units, there may also be provided a necessary pixel defining structure, such as, a pixel defining layer or a black matrix for pixel definition (excluding a black matrix for shielding driving elements).

For example, in some examples, as shown in FIG. 1 and FIG. 2, active display areas 112 of at least three pixel units 110 are provided in each of the plurality of pixel island areas 120, and active display areas 112 of pixel units 110 in each of the plurality of pixel island areas 120 are arranged in an array. In this way, each of the plurality of pixel island areas can separately emit light for at least three gaze points, and thus light field display can be realized. In addition, upon the display panel being used for an integral imaging display device, due to the improvement of resolution or PPI of each pixel island area, more active display areas of pixel units can be provided in each of the plurality of pixel island areas. Thus, it can enable the display panel to provide light for more gaze points. Consequently, the visible range of the integral imaging display device using the display panel can be increased.

For example, in some examples, active display areas of pixel units in each of the plurality of pixel island areas can separately emit light for different gaze points. For example, in a case where each of the plurality of pixel island areas includes active display areas of three pixel units; for each of the plurality of pixel island areas, light for a first gaze point may be emitted by an active display area of one of the three pixel units and are received by a left eye through a projection of a microlens or a pinhole, light for a second gaze point may be emitted by an active display area of another one of the three pixel units and are received by a right eye through a projection of a microlens or a pinhole, so that 3D display can be realized. In addition, light for a third gaze point may be emitted by an active display area of another one of the three pixel units, and may be received by the left eye or right eye through a projection of a microlens or a pinhole in case that the user's eyes have shifted. Thus, light for more gaze points are supplied.

Figure 3:
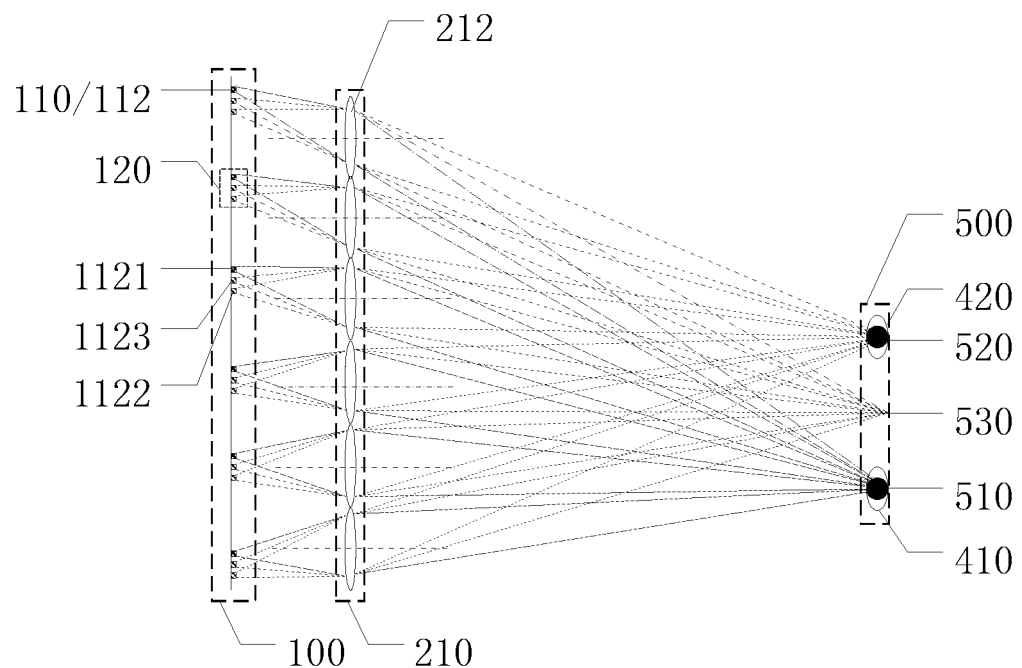
FIG. 3 is a schematic diagram of a display device provided by an embodiment of the present disclosure.

An embodiment of the present disclosure further provides a display device. FIG. 3 is a schematic diagram of a display device provided by an embodiment of the present disclosure. As shown in FIG. 3, the display device includes a display panel 100, which may adopt any of the above display panels.

In the display device provided by the present embodiment, pixel units of the display panel are distributed in a plurality of pixel island areas of the display panel, and pixel units or active display areas of pixel units may not be arranged among the plurality of pixel island areas. Upon the display device being applied in integral imaging display technology, a plurality of pixel island areas may be disposed in correspondence with a microlens array or a pinhole array. In this case, the plurality of pixel island areas may be used for display, while an area among the plurality of pixel island areas is not used for display and has no pixel unit provided therein or has no active display area of pixel unit provided therein. Thus, the pixel utilization ratio of the display panel is improved while integral imaging is realized. In addition, because no pixel unit is provided in the area among the plurality of pixel island areas, and each of the plurality of pixel island areas may only include active display areas of at least two pixel units, some driving elements (e.g., thin film transistors) of pixel units can be provided among the plurality of pixel island areas rather than in the plurality of pixel island areas. Thereby, more active display areas of pixel units can be arranged in each of the plurality of pixel island area, and then, the resolution or PPI of each pixel island area can be improved.

For example, in some examples, as shown in FIG. 3, the display device further includes a microlens array 210, which includes a plurality of microlenses 212. The plurality of microlenses 212 are disposed in one-to-one correspondence with the plurality of pixel island areas 120, and the microlenses 212 can project light emitted by a corresponding pixel island area 120 to a human-eye observing range 500.

For example, as shown in FIG. 3, each of the plurality of pixel island areas 120 includes active display areas 112 of at least three pixel units 110; and the active display areas 112 of at least three pixel units 110 in each of the plurality of pixel island areas 120 can separately emit light for different gaze points. With reference to an example in which each of the plurality of pixel island area 120 includes active display areas of three pixel units 110, for each of the plurality of pixel island area 120, light for a first gaze point may be emitted by an active display area 112 of one of the three pixel units 110 and are received by a left eye 410 through a projection of a corresponding microlens 212, light for a second gaze point may be emitted by an active display area 112 of another one of the three pixel units 110 and are received by a right eye 420 through a projection of a corresponding microlens 212, so that 3D display can be realized. In addition, light for a third gaze point may be emitted by an active display area 112 of another one of the three pixel units 110, and may be received by the left eye or right eye through a projection of a corresponding microlens 212 in case that the user's eyes have shifted. Thus, light for more gaze points are supplied.

For example, in some examples, each of the plurality of microlens can project light emitted by active display areas of at least two pixel units of a corresponding pixel island area to different gaze points. That is, upon active display areas of at least two pixel units in each of the plurality of pixel island areas separately emit light for different gaze points, each of the plurality of microlens can project light emitted by active display areas of at least two pixel units of a corresponding pixel island area to different gaze points. Thus, light for different gaze points that are emitted by active display areas of at least two pixel units in each of the plurality of pixel island areas can be projected to different gaze points.

For example, in some examples, a microlens array allows light emitted by active display areas of at least two pixel units of a plurality of pixel island areas to be focused to at least two gaze points of a human-eye observing range.

For example, in some examples, as shown in FIG. 3, active display areas 112 of at least two pixel units 110 provided in each of the plurality of pixel island areas 120 includes an active display area 1121 of a first pixel unit, an active display area 1122 of a second pixel unit and an active display area 1123 of a third pixel unit. The microlens array 210 can focus light emitted by the active display areas 1121 of the first pixel units provided in the plurality of pixel island areas 120 at a first gaze point 510 of a human-eye observing range 500, focus light emitted by the active display areas 1122 of the second pixel units at a second gaze point 520 of the human-eye observing range 500, and focus light emitted by the active display areas 1123 of the third pixel units at a third gaze point 530 of the human-eye observing range 500.

Figure 4:
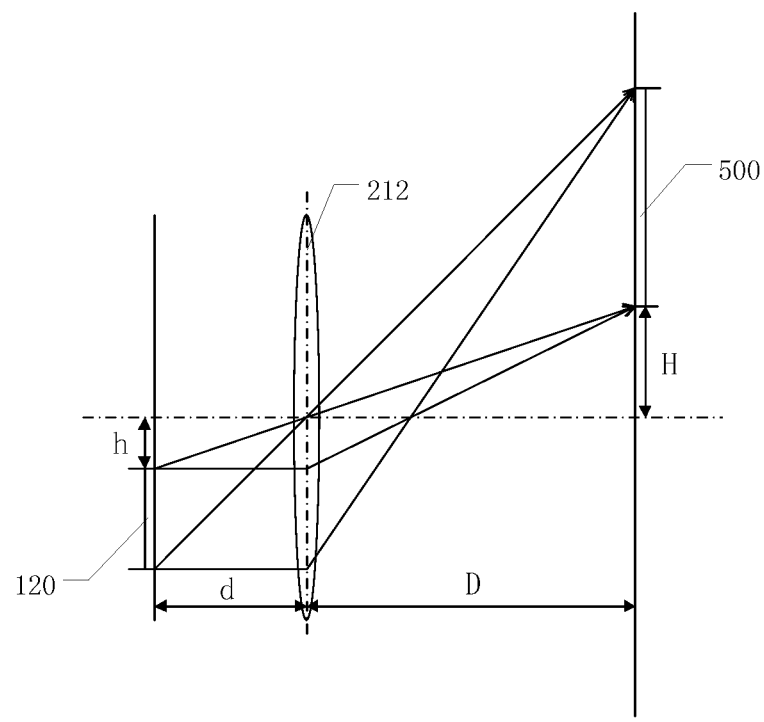
FIG. 4 is a schematic diagram of a geometrically optical relationship between a pixel island area and a human-eye observing range provided by an embodiment of the present disclosure.

For example, as shown in FIG. 3, a plurality of pixel island areas 120 may be arranged in a displaying face of the display panel non-uniformly. Because light emitted by each of the plurality of pixel island areas needs to be projected to the human-eye observing range 500 through a corresponding microlens or a corresponding pinhole, the relative position relationships between the pixel island areas 120 in different places of the display panel 100 and the corresponding microlenses 212 are different. Thus, the plurality of pixel island areas 120 are arranged non-uniformly. For example, as shown in FIG. 3, an orthographic projection of the human-eye observing range 500 on the display panel 100 is located in an intermediate area of the display panel 100, a pixel island area 120 at an edge of the display panel 100 needs to deviate from a center of the corresponding microlens 212, so as to ensure that light emitted by pixel island area 120 can be projected to the human-eye observing range 500. FIG. 4 is a schematic diagram of a geometrically optical relationship between a pixel island area and a human-eye observing range provided by an embodiment of the present disclosure. As shown in FIG. 4, in a case where the human-eye observing range 500 is located on an upside of a central axis of a microlens 212 of the display device, and a distance from an edge of the human-eye observing range 500 to the central axis of the microlens 212 is H, the pixel island area 120 disposed in correspondence with the microlens 212 needs to deviate from the central axis of the corresponding microlens 212 by a distance h, so as to ensure that light emitted by the pixel island area 120 can be projected to the human-eye observing range 500. Moreover, a case where a distance between the pixel island area 120 and the microlens 212 is d, and a distance between the human-eye observing range 500 and the microlens 212 is D, the size of h can be calculated according to the following formula:

$$\frac{H}{h} = \frac{D}{d}$$

Figure 5:
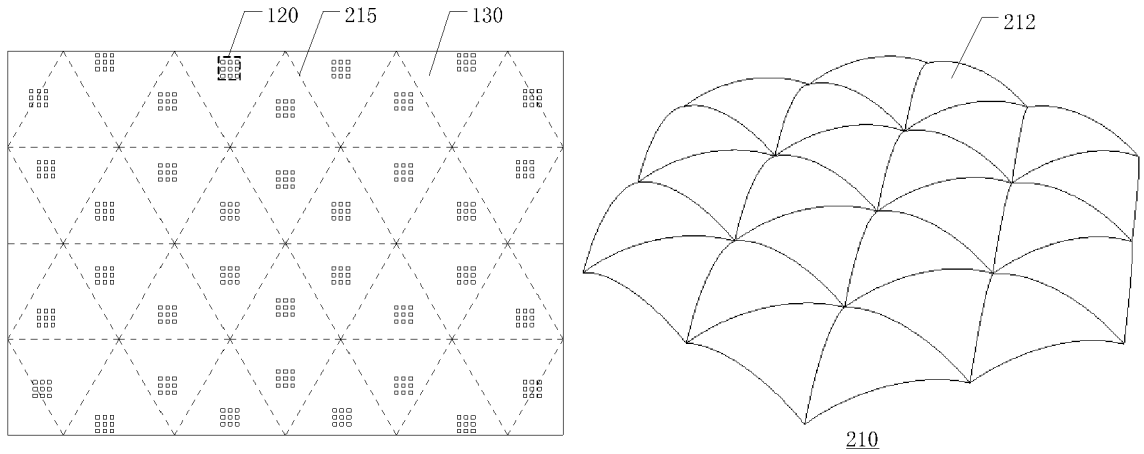
FIG. 5 is a schematic diagram of a positional relationship between a pixel island area and a microlens array of a display device provided by an embodiment of the present disclosure.

FIG. 5 is a schematic diagram of a position relationship between the plurality of pixel island areas and a microlens array for a display device provided by an embodiment of the present disclosure. As shown in FIG. 5, the plurality of microlenses 212 may be triangular microlenses, and the triangular microlenses 212 are arranged densely to form a microlens array 210. A plurality of microlenses 212 are disposed in one-to-one correspondence with the plurality of pixel island areas 120; and the pixel island areas 120 are arranged non-uniformly. In addition, as shown in FIG. 5, a profile 215 of a triangular microlens 212 does not form a restriction on a corresponding pixel island area 120. That is, the pixel island area 120 does not need to be arranged in an area enclosed by the profile 215 of a triangular microlens 212 disposed correspondingly, as long as light emitted by the pixel island area 120 can be projected to the human-eye observing range through the triangular microlens 212 disposed correspondingly. It is to be noted that, the "arranged densely" mentioned above means that there is no interval between adjacent microlenses.

Figure 6:
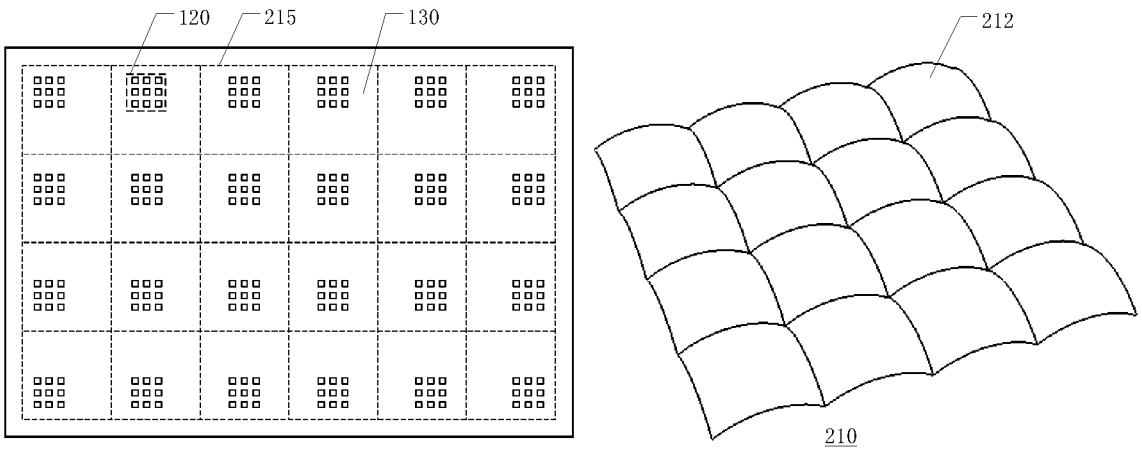
FIG. 6 is a schematic diagram of a positional relationship of the plurality of pixel island areas and a microlens array of another display device provided by an embodiment of the present disclosure.

FIG. 6 is a schematic diagram of a position relationship between the plurality of pixel island areas and a microlens array of another display device provided by an embodiment of the present disclosure. As shown in FIG. 6, microlenses 212 may be rectangular microlenses, and the rectangular microlenses 212 are densely arranged to form a microlens array 210. The plurality of microlenses 212 are disposed in one-to-one correspondence with the plurality of pixel island areas 120; and the pixel island areas 120 are arranged non-uniformly. In addition, as shown in FIG. 6, a profile 215 of a rectangular microlens 212 does not form a restriction on a corresponding pixel island area 120. That is, a pixel island area 120 does not need to be arranged in an area enclosed by the profile 215 of a rectangular microlens 212 disposed correspondingly, as long as light emitted by the pixel island area 120 can be projected to the human-eye observing range through the rectangular microlens 212 disposed correspondingly.

Figure 7:
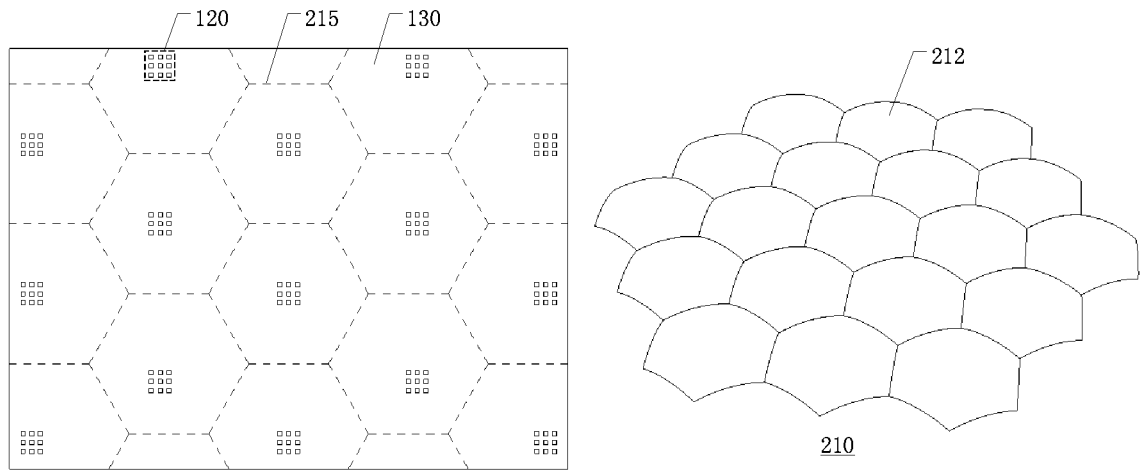
FIG. 7 is a schematic diagram of a positional relationship between the plurality of pixel island areas and a microlens array of another display device provided by an embodiment of the present disclosure.

FIG. 7 is a schematic diagram of the position relationship between the plurality of pixel island areas and a microlens array of another display device provided by an embodiment of the present disclosure. As shown in FIG. 7, microlenses 212 may be hexagonal microlenses, and the hexagonal microlenses 212 are densely arranged to form a microlens array 210. the plurality of microlenses 212 are disposed in one-to-one correspondence with the plurality of pixel island areas 120; and the pixel island areas 120 are arranged non-uniformly. In addition, as shown in FIG. 7, a profile 215 of a hexagonal microlens 212 does not form a restriction on a corresponding pixel island area 120. That is, a pixel island area 120 does not need to be arranged in an area enclosed by the profile 215 of a hexagonal microlens 212 disposed correspondingly, as long as light emitted by the pixel island area 120 can be projected to the human-eye observing range through the hexagonal microlens 212 disposed correspondingly.

Figure 8:
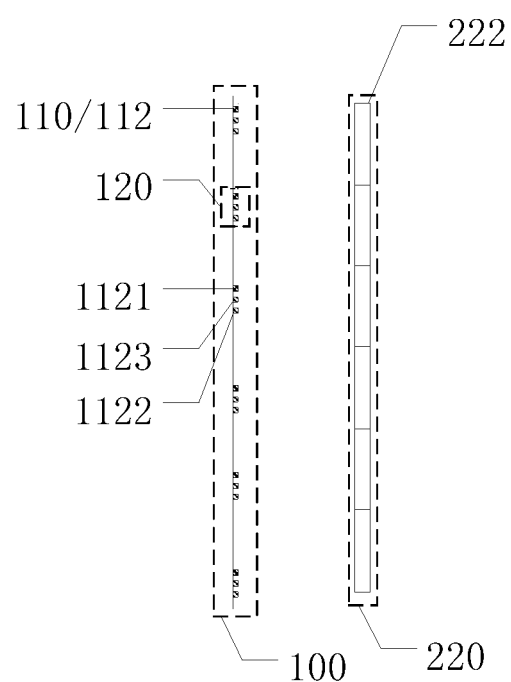
FIG. 8 is a schematic view of another display device provided by an embodiment of the present disclosure.

FIG. 8 is a schematic diagram of another display device provided by an embodiment of the present disclosure. As shown in FIG. 8, unlike the display device in the above example, the display device includes a pinhole array 220, which replaces the microlens array in the above example. Similarly, the pinhole array 220 includes a plurality of pinholes 222, and the plurality of pinholes 222 are disposed in one-to-one correspondence with the plurality of pixel island areas 120.

For example, in some examples, the display device may be any product or component having a display function, such as a smartphone, a tablet computer, a television, a display, a notebook computer, a digital photo frame, a navigator or the like.

The following points should be noted:

(1) The accompanying drawings in the embodiments of the present disclosure only involve structures relevant to the embodiments of the present disclosure, and other structures may refer to the prior art.

(2) The features in the same embodiment or different embodiments of the present disclosure can be mutually combined without conflict.

The foregoing is only the embodiments of the present disclosure and not intended to limit the scope of protection of the present disclosure, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A display panel, comprising: a plurality of pixel island areas; and an interval area, surrounding the plurality of pixel island areas, and located between two adjacent ones of the plurality of pixel island areas, wherein each of the plurality of pixel island areas comprises active display areas of at least two pixel units, and a distance between two adjacent ones of the at least two pixel units in each of the plurality of pixel island areas is smaller than a distance between two adjacent ones of the plurality of pixel island areas, the interval area is a non-display area, the at least two pixel units of each of the plurality of pixel island areas comprise at least two driving elements, the at least two driving elements and the at least two pixel units are disposed in one-to-one correspondence, each of the at least two pixel units comprises one driving element, and the driving element is located in the interval area, and configured for controlling on/off of a corresponding pixel unit, all pixel units of the display panel are located in the plurality of pixel island areas and configured to jointly display an image, for each of the plurality of pixel island areas, the at least two driving elements of the at least two pixel units are located at, at least two sides of the each of the plurality of pixel island areas.

2. The display panel according to claim 1, wherein the driving element comprises a thin film transistor.

3. The display panel according to claim 1, wherein the plurality of pixel island areas are arranged non-uniformly in a displaying face of the display panel.

4. The display panel according to claim 1, wherein each of the plurality of pixel island areas comprises active display areas of at least three pixel units, and the active display areas of the at least three pixel units in each of the plurality of pixel island areas are arranged in an array.

5. The display panel according to claim 1, wherein the active display areas of the at least two pixel units in each of the plurality of pixel island areas are configured to separately emit light for different gaze points.

6. The display panel according to claim 1, wherein the distance between two adjacent ones of the plurality of pixel island areas is three times greater than the distance between two adjacent ones of the at least two pixel units in each of the plurality of pixel island areas.

7. A display device, comprising the display panel according to claim 1.

8. The display device according to claim 7, further comprising:
   a microlens array, comprising a plurality of microlenses,
      wherein the plurality of microlenses are disposed in one-to-one correspondence with the plurality of pixel island areas, and each of the plurality of microlenses is configured to project light emitted by a corresponding pixel island area to a human-eye observing range.

9. The display device according to claim 8, wherein each of the plurality of microlenses comprises a triangular microlens, a rectangular microlens or a hexagonal microlens.

10. The display device according to claim 8, wherein each of the plurality of microlenses is configured to project light emitted by the active display areas of the at least two pixel units of the corresponding pixel island area to different gaze points.

11. The display device according to claim 8, wherein the microlens array is configured to focus light emitted by the active display areas of the at least two pixel units of the plurality of pixel island areas to at least two gaze points of the human-eye observing range.

12. The display device according to claim 11, wherein the active display areas of the at least two pixel units arranged in each of the plurality of pixel island areas comprise an active display area of a first pixel unit, an active display area of a second pixel unit, and an active display area of a third pixel unit, the microlens array is configured to focus light emitted by the active display areas of the first pixel units provided in the plurality of pixel island areas at a first gaze point of the human-eye observing range, to focus light emitted by the active display areas of the second pixel units provided in the plurality of pixel island areas at a second gaze point of the human-eye observing range, and to focus light emitted by the active display areas of the second pixel units provided in the plurality of pixel island areas at a third gaze point of the human-eye observing range.

13. The display device according to claim 7, further comprising:
   a pinhole array, comprising a plurality of pinholes,
      wherein the plurality of pinholes are disposed in one-to-one correspondence with the plurality of pixel island areas.

14. The display panel according to claim 4, wherein each of the plurality of pixel island areas comprises active display areas of at least six pixel units, and the active display areas of the at least six pixel units in each of the plurality of pixel island areas are arranged in an array,
   driving elements of the at least six pixel units included in each of the plurality of pixel island areas surround the each of the plurality of pixel island areas.

15. The display panel according to claim 1, wherein no thin film transistor is provided in the plurality of pixel island areas.

16. The display panel according to claim 1, wherein the driving element is connected with the active display area of the corresponding pixel unit through a wire,
   for each of the plurality of pixel island areas, a length of at least one wire is larger than a length of one of the active areas.

* * * * *